Feb. 14, 1950 W. E. BRADLEY 2,497,290
FREQUENCY DETECTOR AND FREQUENCY CONTROL CIRCUITS
Filed Oct. 17, 1947
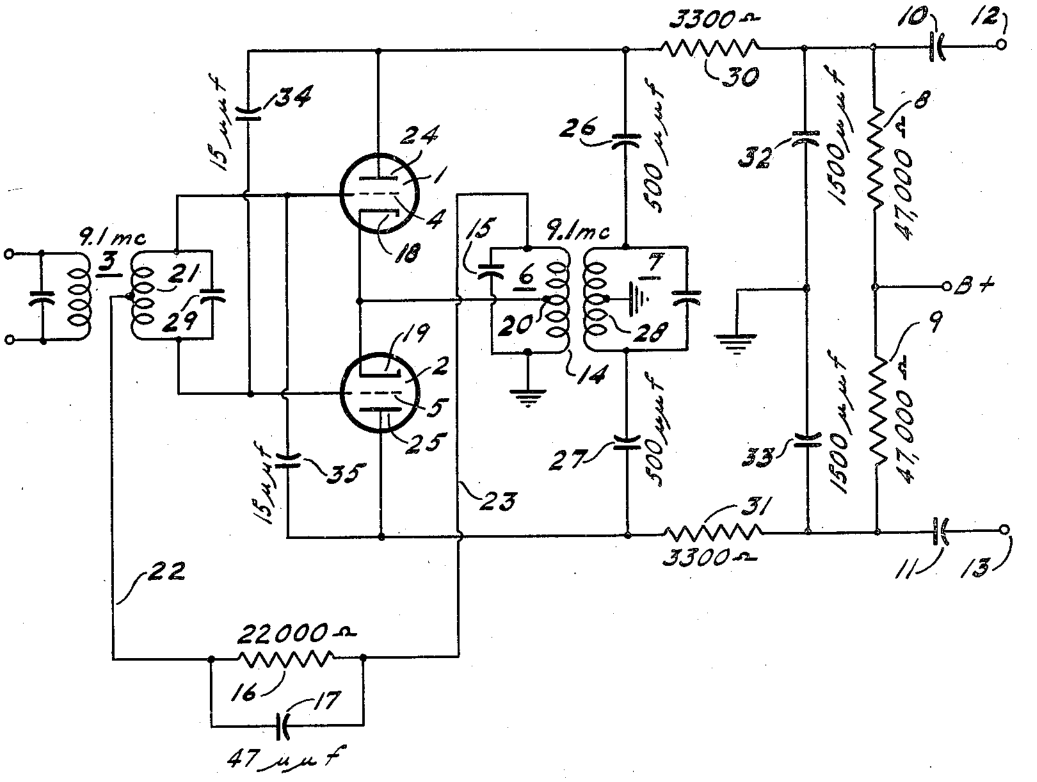
INVENTOR.
WILLIAM E. BRADLEY
BY
Brown, Denk & Synnestvedt
AGENTS Patented Feb. 14, 1950 2,497,290

UNITED STATES PATENT OFFICE 2,497,290

FREQUENCY DETECTOR AND FREQUENCY CONTROL CIRCUITS

William E. Bradley, Springfield, Pa., assignor to Philco Corporation, Philadelphia, Pa., a corporation of Pennsylvania Application October 17, 1947, Serial No. 780,343

11 Claims. (Cl. 250—27)

The invention herein described and claimed relates to electrical circuit arrangements adapted for use in frequency control circuits, frequency modulation detectors, and the like. In one of its more specific aspects, the present invention relates to an improved frequency modulation detector of the synchronized-oscillator type.

A previously developed form of the synchronized-oscillator type of frequency modulation detector is disclosed in my copending application, Serial No. 576,057, filed February 3, 1945, now United States Patent No. 2,494,795, issued January 17, 1950. Frequency modulation detectors of the type described therein are now well known in the art, and are employed extensively in frequency modulation radio receivers. A specific commercial embodiment of the detector disclosed in the copending application is described in an article entitled "Single-stage F-M detector," published in the October 1946 issue of "Electronics."

The present invention is directed to certain improvements in these detectors which permit the use of simple tube types, for example a pair of triodes, in place of the more complex heptode employed heretofore. It is to be understood, however, that the circuit arrangement of the present invention utilizes the broad novel principles disclosed in my copending application, distinguishing over other prior detectors of the synchronized-oscillator type in that synchronization of the oscillator section of the detector is by quadrature or wattless control, and not by direct application of the frequency-modulated carrier signal to the oscillator tank circuit. Direct control, or synchronization, of the oscillator by carrier-signal injection is known to be disadvantageous in detectors of the synchronized-oscillator type, since such control increases very substantially the response of the system to amplitude modulation and hence to noise. The present frequency modulation detector, through the use of broad principles disclosed in the above-identified copending application, is highly reliable, and so insensible to noise and to amplitude variations that the use of limiters is unnecessary.

In accordance with one feature of the invention, there is provided a combination oscillator and reactance-tube circuit in which the frequency of the oscillator section may be controlled in accordance with a control voltage applied to the input circuit of the system.

In accordance with another feature of the invention there is provided an oscillator of controllable frequency comprising, in combination, a resonant, frequency-determining tank circuit, a pair of vacuum tubes each having at least a cathode, a grid and an anode, a circuit-arrangement including said tubes and said tank circuit for generating self-sustained oscillations at substantially the resonant frequency of said tank circuit, said tubes being connected effectively in parallel in said oscillation-generating circuit-arrangement, means for deriving oscillatory energy from each of said tubes individually, means for applying said derived oscillatory energy differentially to said tank circuit and in quadrature relation to the generated oscillations therein, and means for varying the magnitude of the anode current in said tubes in opposite senses. In practice the last-named means may comprise any suitable means for varying the anode current, as, for example, by the differential application of direct-current control biases or voltages to the grid circuits of the tubes, or by the differential application thereto of alternating voltages bearing a harmonic relation to the generated oscillations.

In accordance with still another feature of the invention there is provided a frequency modulation detector of the synchronized oscillator type, said detector comprising: a pair of tubes each having at least a cathode, a grid and an anode, means including a resonant tank circuit and said tubes for generating oscillations of predetermined frequency, said tubes being connected effectively in parallel in said oscillation generating means, means for applying a frequency-modulated carrier wave to said grids in differential relation, the carrier frequency of said wave being harmonically related to the frequency of said oscillations, a tuned circuit coupled differentially to said anodes and inductively to said tank circuit, said tuned circuit being tuned to the frequency of said tank circuit, and an audio frequency load circuit connected in the anode circuit of at least one of said tubes.

It is an object of the present invention to provide an improved circuit arrangement for controlling the frequency of an oscillator by the application thereto of a control voltage.

It is another object of the present invention to provide an improved circuit for synchronizing an oscillator with an alternating current signal, either at the signal's fundamental or at a subharmonic thereof.

It is a further object of the present invention to provide a frequency modulation detector which is insensible to amplitude modulation.

It is a further object of the present invention to provide a frequency modulation detector of the synchronized-oscillator type which may be driven from a high impedance source.

It is another object of the invention to provide a frequency modulation detector having a substantially linear operating characteristic, and capable of providing a high level audio output signal.

It is a further object of the invention to provide a novel frequency modulation detector of the synchronized-oscillator type employing vacuum tubes of the simplest construction.

It is still another object of the invention to provide a frequency modulation detector of the synchronized oscillator type which is so constructed and arranged as to insure that only reactive control power is supplied to the oscillator.

These and other objects of the invention, and the manner in which they are attained, will appear from the following description and the accompanying drawing in which the single figure is a schematic illustration of a preferred embodiment of the invention.

To facilitate an understanding of the circuit illustrated, the resonant frequency of the tuned circuits and the specific values of the more important electrical components have been indicated directly on the drawing. Although representative of values which have been successfully employed in practice, it will, of course, be apparent to those skilled in the art that these values are subject to considerable variation by the designer.

Briefly, the detector circuit illustrated in the drawing comprises a pair of triodes 1 and 2, a double-tuned input transformer 3 by means of which a frequency-modulated carrier wave—usually at an intermediate frequency—may be applied in push-pull relation to control grids 4 and 5, an oscillator tank circuit 6 tuned to the frequency of the applied signal or to a sub-harmonic thereof, a resonant circuit 7 tuned to the frequency of tank circuit 6 and adapted to supply the tank circuit 6 with an alternating control voltage bearing a quadrature phase relation with the alternating voltage in the tank, and an audio output circuit including the audio frequency load resistors 8—9, coupling condensers 10—11, and audio output terminals 12, 13. The triodes 1—2 may conveniently be combined in a single envelope as, for example, in the 6SN7, a standard double-triode type which has given good performance in tests of the subject invention. Triodes having a relatively sharp plate-current cut-off characteristic (such as the 6SL7) may be preferred in some instances.

The oscillator section is comprised of the tank circuit 6 (which includes the tapped inductor 14 and tuning capacitor 15), the grid leak, grid condenser combination 16—17, and triodes 1—2 acting in parallel. The foregoing elements constitute a conventional Hartley oscillator in which the cathodes 18—19 are connected to the usual intermediate tap 20 on the tank inductor 14, and the grids 4—5 are returned, through winding 21, conductor 22, the grid leak, grid condenser combination 16—17, and conductor 23, to the upper end of the oscillator tank 6. The anodes 24—25 are effectively connected to the grounded end of the oscillator tank circuit 6 through the I.-F. coupling capacitors 26—27 and the winding 28, the center point of which may be grounded as indicated in the drawing. Experience shows, however, that, in practice, it is not usually necessary to ground the mid-point of winding 28, the impedance of the anode-to-ground circuit ordinarily being sufficiently low to provide the necessary coupling between the anodes and ground. As in the systems described in the above-identified co-pending application, the oscillator is preferably adjusted to operate under Class C conditions wherein plate current flows in the triodes in relatively short pulses.

In the absence of an input signal, the circuit, with the triodes effectively in parallel, operates as a conventional, grounded-anode, cathode-driven Hartley oscillator, the system oscillating at the resonant frequency of the tank circuit 6. Under these conditions neither the resonant circuit 7 connected between the anodes 24 and 25, nor the resonant circuit 21, 29 connected between grids 4 and 5 have any appreciable effect upon the operation of the circuit. As will appear hereinafter, it is only when the application of a carrier wave signal to the grids 4 and 5 produces an unbalance in the operation of the triodes that the resonant plate circuit 7 becomes effective to inject a quadrature, frequency-controlling voltage into the oscillator tank circuit 6.

As indicated above, the frequency-modulated carrier wave is applied to the triodes 1—2 in push-pull relation. The secondary winding 21 of the input transformer 3 is balanced with respect to ground, so that the signal voltage to ground at the center tap is zero, and thus the intermediate frequency signal is not applied to the oscillator tank 6, notwithstanding the intervening presence of the grid leak, grid condenser combination 16—17. The intermediate frequency signal voltage is, however, applied, together with the oscillator voltage, to grids 4 and 5, the oscillator voltage being applied to the grids in like phase while the intermediate frequency signal voltage is applied differentially.

In considering the operation of the system, it will be assumed that the oscillator section of the detector is operating under Class C conditions, and that the oscillator voltage is so large compared to the applied signal voltage that the oscillator voltage alone determines the interval during which plate current flows. The triodes are, as previously stated, in parallel with reference to the oscillator, and accordingly the flow of plate current occurs in each tube at the same instant. The effect of the applied intermediate frequency signal, as will be made evident hereinafter, is primarily to vary the relative magnitude of the pulses of plate current in the two triodes. The mode of operation above assumed is the ideal mode of operation and can be very closely approached in practice.

Since the plate circuits of the triodes 1 and 2 are coupled to the oscillator tank circuit 6 inductively, and differentially, by way of the resonant plate circuit 7, it follows that one of the triodes will act to deliver positive reactive power to the oscillator while the other will supply negative reactive power. So long as there is no unbalance between the triodes the magnitudes of the positive and negative reactive power components remain equal and there is no resultant reactive power to affect the frequency of the oscillator. However when an unbalance occurs, the difference between the reactive power supplied by triode 1 and that supplied by triode 2 is effective to change the frequency of the oscillator in a direction depending upon the sign of the difference. In other words, any unbalance of plate current between the two triodes causes a deviation in the operating frequency of the oscillator even though the phase relations between the plate-current pulses and the oscillator voltage are not affected.

When the frequency of the applied intermediate frequency signal is equal to the uncontrolled frequency of the oscillator the tendency is (as in the systems of the above-identified copending application) for the oscillator voltage to assume a phase quadrature relation with the applied signal. In the phase quadrature condition the currents in the triodes remain equal, because the pulses of plate current occur as the I.-F. signal voltages applied to grids 4 and 5 pass through zero, one in the direction negative to positive, and the other in the direction positive to negative. Under these conditions the plate current pulses in the two tubes are equal in magnitude and, accordingly, there is no resultant or unbalanced reactive output to shift the oscillator frequency.

However when the frequency of the applied signal is deviated, in either direction, from the free-running frequency of the oscillator, the pulses of plate current in one of the triodes will increase while those in the other will decrease correspondingly, causing an increase in the reactive power of one sign and a decrease of reactive power of opposite sign. The resultant power, applied to the oscillator tank 6 by way of the tuned circuit 7, acts to change the frequency of the oscillator to an extent and in a direction depending upon the magnitude and sign of the reactive power.

As in the system of my copending application, the phase relation between the applied signal and the oscillator voltage varies from the normal quadrature relation in accordance with the frequency deviation of the applied signal, but, again as in my prior system, the reactive control voltage is always in substantially precise quadrature relation with the oscillator voltage. Accordingly the control voltage is capable of discharging its assigned function of frequency control of the oscillator, but is incapable of affecting the amplitude of the oscillator voltage. This is of great importance in any system which is to be substantially insensible to amplitude variation of the received signal and to impulse noise.

As indicated above, when the frequency of the applied signal is deviated, the pulses of plate current in one of the triodes will increase in magnitude while those in the other will decrease correspondingly. Accordingly, if a low-frequency load impedance be provided in the anode circuit of one or both of the triodes, a voltage will be developed thereacross indicative of the frequency modulation of the applied carrier. In the circuit illustrated a pair of load resistors 8 and 9 are provided across which the detected audio frequency voltage may be developed. Because of the differential connection of these resistors in the plate circuits of the triodes, a push-pull output signal is available at the terminals 12—13. The series resistor elements 30—31 in combination with the shunt capacitors 32—33 serve to provide the desired high-frequency deemphasis, and as I.-F. filter means between the carrier frequency circuits and the audio frequency output terminals.

To insure that the reactive control voltage remain in quadrature with the oscillator tank voltage over the entire band it is desirable to damp the tuned circuit 7 to increase its bandwidth, and preferably this circuit is damped sufficiently to give it a bandwidth of the order of six times the normal deviation range of the detector as suggested in my copending application. The circuit 7 may, of course, be damped by the provision of a damping resistor connected directly in shunt therewith, but in the illustration damping is provided by the resistors 30 and 31 which, with capacitors 26—27 and 32—33, are connected serially across the tuned circuit 7.

In order to prevent the generation of spurious oscillations it is desirable to neutralize the circuit. This may be done most readily by the provision of plate-to-grid neutralizing capacitors 34—35.

Although individual biasing networks may be provided for each of the triodes separately, it is preferred to bias the tubes through the agency of a single grid leak, grid condenser combination 16—17, common to the grid circuits of both tubes. Because the grid currents in the two tubes vary differentially with frequency modulation of the received signal, the bias developed across the RC circuit 16—17 tends to remain constant.

Tests of the circuit of the present invention show that the FM/AM ratio of the detector is better than one hundred to one for a 75 kc. frequency deviation versus 30% amplitude modulation. An intermediate-frequency input signal of about 2.5 volts per tube (5 volts grid-to-grid) was required to insure lock-in for frequency deviations of plus and minus 75 kc. Since the performance of the present circuit is not deleteriously affected by the presence of a high, driving-circuit impedance, it is practical, and indeed desirable, to design the input transformer 3 to give high voltage gain. In tests, the audio frequency output obtained from the system was approximately 20 volts peak-to-peak for 75 kc. peak deviation. Excellent linearity was obtained throughout the operating range.

As indicated previously the oscillator and frequency-control section of the circuit illustrated in the drawing may, if desired, be adjusted to operate at a sub-harmonic of the frequency of the signal applied to grids 4 and 5, after the manner of sub-harmonic operation described in a copending application of C. T. McCoy, Serial No. 528,908, filed March 31, 1944, now United States Patent No. 2,462,759 issued February 22, 1949. To practice such sub-harmonic operation it is only necessary to resonate the oscillator tank circuit 6 and the associated tuned circuit 7 to the desired sub-harmonic frequency, the input circuit 3 being tuned, of course, to the fundamental signal frequency. When the sub-harmonic mode of operation is employed it will not ordinarily be necessary to provide the neutralizing capacitors 34—35.

Although it is an important aspect of the present invention that a high quality, high level, detected signal may be derived directly from the plate circuits of the tubes 1 and 2, it will be apparent that the frequency-modulated signal generated by the oscillator section of the circuit may, if desired, be supplied to a conventional frequency discriminator for detection in the usual way. When this mode of operation is employed, the circuit illustrated in the drawing should be regarded, not as a frequency modulation detector, but rather as an arrangement for synchronizing an oscillator with the signals applied to the transformer 3. When such synchronization is the sole object of the circuit, the low frequency load impedance 8 and 9 may, of course, be omitted.

The system hereinbefore described and illustrated may also be employed advantageously as a frequency discriminator in an automatic frequency-control system. In such an arrangement the direct-current or "control" component of the system's output voltage may, of course, be derived directly from either or both of the low frequency load resistors 8—9, and applied to a suitable frequency-control circuit by way of a low-pass filter, as is customary in the automatic frequency-control art.

For the reasons explained at length in my above-identified copending application, a Class C mode of operation of the circuit is greatly preferred because of the important advantages provided. However it is to be understood that the present invention also contemplates the use of Class A and Class B modes of operation, since such modes can be employed to provide a synchronized oscillator performance which is at least comparable to that provided by prior, directly-synchronized systems.

Although my invention has been described with particular reference to a specific, preferred embodiment, it will be apparent that the invention is capable of other forms of physical expression, and is, accordingly, limited only by the spirit and scope of the appended claims.

I claim:

1. A frequency modulation detector of the synchronized oscillator type, said detector comprising: a pair of tubes each having at least a cathode, a grid and an anode, a resonant tank circuit, means connecting said tubes in parallel with each other and in regenerative relation with said tank circuit for generating oscillations of predetermined frequency, means for applying a frequency-modulated carrier wave to said grids in differential relation, the carrier frequency of said wave being harmonically related to the frequency of said oscillations, a tuned circuit coupled differentially to said anodes and inductively to said tank circuit, said tuned circuit being tuned to the frequency of said tank circuit, and an audio frequency load circuit connected in the anode circuit of at least one of said tubes.

2. A frequency modulation detector as claimed in claim 1, characterized in the provision of grid biasing means for limiting the flow of anode current in said tubes to short, time-spaced pulses.

3. An oscillator of controllable frequency comprising a pair of vacuum tubes each having at least a cathode, a grid and an anode, a tuned circuit connected between said anodes, a resonant tank circuit coupled to said tuned circuit by mutual inductance, said tuned circuit and said resonant tank circuit being resonant to the same frequency, a connection between a first point on said resonant tank circuit and said grids, a connection between a second point on said resonant tank circuit and a point of substantially fixed potential, a connection between said cathodes and an intermediate point on said resonant tank circuit, a path between said anodes and said point of fixed potential, said path having relatively low impedance at the resonant frequency of said tuned circuit, and means for differentially varying the magnitudes of the plate current in said tubes.

4. A frequency modulation detector of the synchronized oscillator type, said detector comprising: a pair of vacuum tubes each having at least a cathode, a grid and an anode, an inductance coil connected between said grids, means for applying a frequency-modulated carrier wave to said grids in push-pull relation, a tuned circuit connected between said anodes, a resonant tank circuit coupled to said tuned circuit by mutual inductance, said tuned circuit and said resonant tank circuit being resonant to the same frequency, said frequency being harmonically related to the frequency of said applied carrier wave, a connection between a first point on said resonant tank circuit and the electrical center of said inductance coil, a connection between a second point on said resonant tank circuit and a point of substantially fixed potential, a connection between said cathodes and an intermediate point on said resonant tank circuit, a path between said anodes and said point of fixed potential, said path having relatively low impedance at the operating frequency of said detector, and a low-frequency load impedance connected in the anode circuit of each of said tubes.

5. The frequency modulation detector claimed in claim 4, characterized in the provision of a grid-leak, grid-condenser combination in the connection between said first point on said resonant tank circuit and the center of said inductance coil.

6. The frequency modulation detector claimed in claim 5, wherein the constants of said grid-leak, grid-condenser combination are such as to limit the flow of anode current in said tubes to less than half of each cycle.

7. The combination comprising a source of control voltage, a pair of vacuum tubes each having at least a cathode, a grid and an anode, a resonant tank circuit, means connecting said tubes in parallel with each other and in regenerative relation with said tank circuit for generating oscillations at substantially the resonant frequency of said tank circuit, means for applying said control voltage in push-pull relation to the grid-cathode circuits of said vacuum tubes, thereby differentially to vary the magnitudes of the plate currents in said tubes, means for deriving oscillatory energy from each of said tubes individually, and means for applying the difference in said derived energies to said tank circuit in quadrature relation to the generated oscillations therein.

8. The combination comprising a source of control voltage, a pair of vacuum tubes each having at least a cathode, a grid and an anode, a resonant tank circuit, means connecting said tubes in parallel with each other and in regenerative relation with said tank circuit for generating sustained oscillations at substantially the resonant frequency of said tank circuit, a tuned circuit coupled differentially to said anodes and inductively to said tank circuit, and means for applying said control voltage in push-pull relation to the grid-cathode circuits of said vacuum tubes, thereby differentially to vary the magnitudes of the plate currents in said tubes.

9. The combination claimed in claim 8, characterized in the provision of a grid biasing means for limiting the flow of anode current in said tubes to short discrete pulses.

10. The combination claimed in claim 9, characterized in that said grid biasing means comprises a single grid-leak, grid-condenser combination common to the grid-cathode circuits of both said tubes.

11. The combination comprising a source of alternating control voltage, a pair of vacuum tubes each having at least a cathode, a grid and an anode, a resonant tank circuit, means connecting said tubes in parallel with each other and in regenerative relation with said tank circuit for generating sustained oscillations the frequency of which is harmonically related to the frequency of said alternating control voltage, means for applying said alternating control voltage to the grid circuits of said tubes in differential relation, and a tuned circuit coupled differentially to said anodes and inductively to said tank circuit, said tuned circuit being tuned to the frequency of said tank circuit.

WILLIAM E. BRADLEY.

REFERENCES CITED

The following references are of record in the file of this patent:

UNITED STATES PATENTS

| Number | Name | Date |
|---|---|---|
| 2,326,314 | Usselman | Aug. 10, 1943 |
| 2,332,540 | Travis | Oct. 26, 1943 |
| 2,429,747 | Crosby | Oct. 28, 1947 |